United States Patent
Hu

(10) Patent No.: US 12,100,632 B2
(45) Date of Patent: Sep. 24, 2024

(54) GLASS CORE SUBSTRATE AND MANUFACTURING METHOD THEREOF

(71) Applicant: Dyi-Chung Hu, Hsinchu County (TW)

(72) Inventor: Dyi-Chung Hu, Hsinchu County (TW)

(*) Notice: Subject to any disclaimer, the term of this patent is extended or adjusted under 35 U.S.C. 154(b) by 0 days.

(21) Appl. No.: 18/432,090

(22) Filed: Feb. 5, 2024

(65) Prior Publication Data

US 2024/0274482 A1    Aug. 15, 2024

Related U.S. Application Data

(60) Provisional application No. 63/589,964, filed on Oct. 12, 2023, provisional application No. 63/542,090, filed on Oct. 3, 2023, provisional application No. 63/444,566, filed on Feb. 10, 2023.

(30) Foreign Application Priority Data

Dec. 29, 2023   (TW) .................................. 112151496

(51) Int. Cl.
*H01L 23/15* (2006.01)
*H01L 21/48* (2006.01)
*H01L 23/498* (2006.01)

(52) U.S. Cl.
CPC .......... *H01L 23/15* (2013.01); *H01L 21/4857* (2013.01); *H01L 21/486* (2013.01); *H01L 23/49816* (2013.01); *H01L 23/49822* (2013.01); *H01L 23/49827* (2013.01)

(58) Field of Classification Search
CPC .............................. H01L 23/15; H01L 21/486
See application file for complete search history.

(56) References Cited

U.S. PATENT DOCUMENTS

| | | | | |
|---|---|---|---|---|
| 2011/0147059 A1* | 6/2011 | Ma | ........................ | H01L 24/73 156/60 |
| 2015/0132538 A1* | 5/2015 | Cleary | .............. | B32B 17/10137 428/141 |
| 2022/0288893 A1* | 9/2022 | Joshi | ................. | B32B 17/10036 |

* cited by examiner

*Primary Examiner* — Sherman Ng
(74) *Attorney, Agent, or Firm* — JCIPRNET

(57) ABSTRACT

A glass core substrate includes a first glass layer, a second glass layer, a first bonding layer, and a conductive connector. The second glass layer is disposed on the first glass layer. The first bonding layer bonds the first glass layer and the second glass layer. The conductive connector passes through the first glass layer, the first bonding layer, and the second glass layer. The conductive connector is configured to provide a vertical conductive path to the glass core substrate. A manufacturing method of the glass core substrate is also provided.

17 Claims, 12 Drawing Sheets

202

GLASS CORE SUBSTRATE AND MANUFACTURING METHOD THEREOF

CROSS-REFERENCE TO RELATED APPLICATION

This application claims the priority benefit of U.S. provisional application Ser. No. 63/444,566, filed on Feb. 10, 2023, U.S. provisional application Ser. No. 63/542,090, filed on Oct. 3, 2023, U.S. provisional application Ser. No. 63/589,964, filed on Oct. 12, 2023 and Taiwan application serial no. 112151496, filed on Dec. 29, 2023. The entirety of each of the above-mentioned patent applications is hereby incorporated by reference herein and made a part of this specification.

BACKGROUND

Technical Field

This disclosure relates to a glass core substrate and a manufacturing method of the glass core substrate.

Description of Related Art

Current glass core substrates are often composed of glass fiber and epoxy resin materials. However, with the increasing requirements for the reliability of the glass core substrates, the glass core substrates are no longer sufficient.

SUMMARY

This disclosure provides a glass core substrate, which can improve reliability of a subsequent product.

A glass core substrate of this disclosure includes a first glass layer, a second glass layer, a first bonding layer, and a conductive connector. The second glass layer is disposed on the first glass layer. The first bonding layer bonds the first glass layer and the second glass layer. The conductive connector passes through the first glass layer, the first bonding layer, and the second glass layer. The conductive connector is configured to provide a vertical conductive path to the glass core substrate.

A manufacturing method of a glass core substrate of this disclosure includes at least the following steps. A first glass layer and a second glass layer are provided. The first glass layer and the second glass layer are bonded through a first bonding layer. A conductive connector passing through the first glass layer, the first bonding layer, and the second glass layer is formed. The conductive connector is configured to provide a vertical conductive path to the glass core substrate.

Based on the above, in this disclosure, the bonding layer is used as a crack-stopping structure through the design of the stacked glass layers. In this way, the phenomenon of rapid propagation of brittle cracks from the edge to the center of the substrate can be reduced, effectively inhibiting the propagation of cracks, thereby improving the reliability of a subsequent product.

In order for the features and advantages of the disclosure to be more comprehensible, the following specific embodiments are described in detail in conjunction with the drawings.

DETAILED DESCRIPTION OF DISCLOSED EMBODIMENTS

Figure 1A:
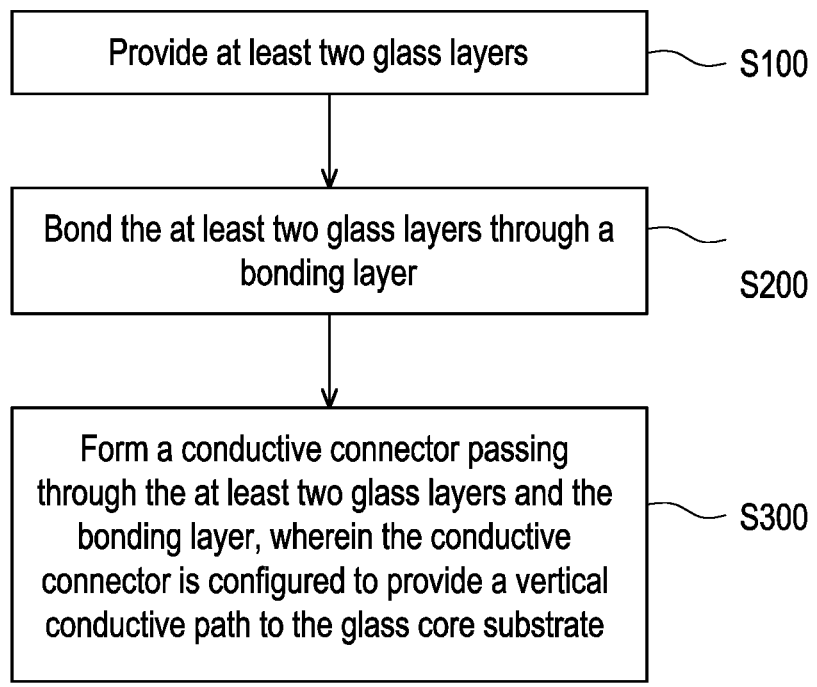
FIG. 1A is a schematic view of a manufacturing process of a glass core substrate according to an embodiment of this disclosure.

Exemplary embodiments of this disclosure will be fully described below with reference to the drawings, but this disclosure may also be implemented in many different forms and should not be interpreted as limited to the embodiments described herein.

This disclosure is explained more fully with reference to the drawings of this embodiment. However, this disclosure may also be embodied in various forms and should not be limited to the embodiments described herein. The thickness, size, or dimensions of layers or regions depicted in the drawings may be exaggerated for clarity. The same or similar reference numerals indicate the same or similar elements and will not be repeated individually in the following paragraphs.

Directional terms (e.g., up, down, right, left, front, back, top, bottom) are used with reference to the drawings and are not intended to imply absolute orientation.

Although the terms "first," "second," "third," etc. are used herein to describe various elements, components, regions, layers, and/or parts, these elements, components, regions, and/or parts shall not be limited by these terms. These terms are used to distinguish one element, component, region, layer, or part from another element, component, region, layer, or part.

Unless otherwise defined, all terms (including technical and scientific) used herein have the same meaning as commonly understood by one ordinarily skilled in the art to which this disclosure belongs.

Unless otherwise stated, the term "between" used to define numerical ranges in this specification intends to cover a range equal to and between the endpoint values. For example, a size range being between a first value and a second value means that the size range covers the first value, the second value, and any value between the first value and the second value.

FIG. 1A is a schematic view of a manufacturing process of a glass core substrate according to an embodiment of this disclosure. Please refer to FIG. 1A. First, at least two glass layers are provided (Step S100). Next, the at least two glass layers are bonded through a bonding layer (Step S200). Then, a conductive connector passing through the at least two glass layers and the bonding layer is formed, wherein the conductive connector is configured to provide a vertical conductive path of the glass core substrate (Step S300). Accordingly, in this disclosure, the bonding layer is used as a crack-stopping structure through the design of the stacked glass layers (a three-dimensional heterogeneous integrated glass core). In this way, the phenomenon of rapid propagation of brittle cracks from the edge to the center of the substrate can be reduced, effectively inhibiting the propagation of cracks, thereby improving the reliability of a subsequent product.

The specific implementation of various glass core substrates that may be formed corresponding to the manufacturing process will be described in detail below. The implementation of the various glass core substrates disclosed below are illustrative descriptions, and different features may be combined arbitrarily according to the actual design requirements. Any content that may be reasonably extended without departing from the spirit of the disclosure belongs to the protection scope of the disclosure.

This disclosure takes three layers of stacked glass layers as an example. However, fewer or more stacked glass layers may be formed according to actual design requirements. As long as at least two glass layers are bonded through a bonding layer and a vertical conductive path is provided by a conductive connector, the features belong to the protection scope of this disclosure.

Figure 1B:
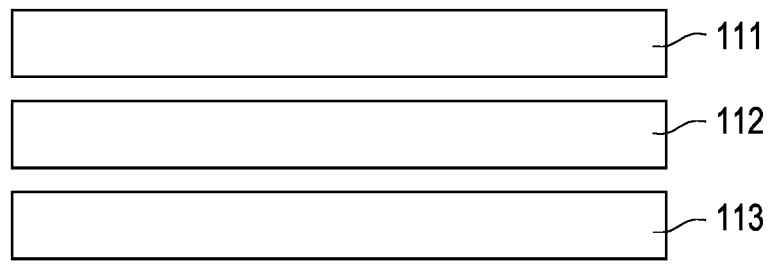
FIG. 1B to FIG. 1H are partially schematic cross-sectional views of a manufacturing method of a glass core substrate according to some embodiments of this disclosure.
Figure 1C:
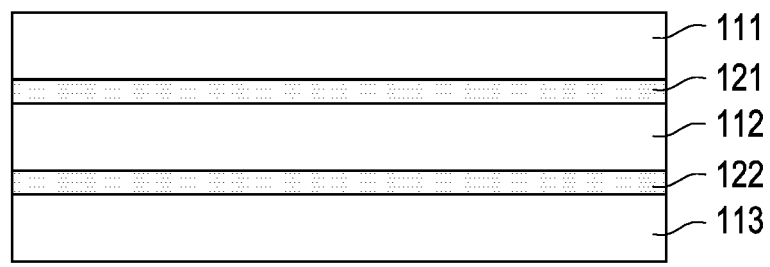

Please refer to FIG. 1B and FIG. 1C. In this embodiment, first, a glass layer 111, a glass layer 112, and a glass layer 113 are provided, and a bonding layer 121 and a bonding layer 122 are respectively formed between the glass layer 111 and the glass layer 112 and the glass layer 112 and the glass layer 113. For example, the bonding layer 121 and the bonding layer 122 are formed comprehensively and respectively extend from one side to the other side (such as from the left side to the right side in the drawings) between the glass layer 111 and the glass layer 112 and between the glass layer 112 and the glass layer 113 to improve the bonding strength and have a better crack-stopping effect, that is, there are no substantial gaps between the glass layer 111 and the glass layer 112 and between the glass layer 112 and the glass layer 113 to better intercept the cracks, but the disclosure is not limited thereto.

Figure 1D:
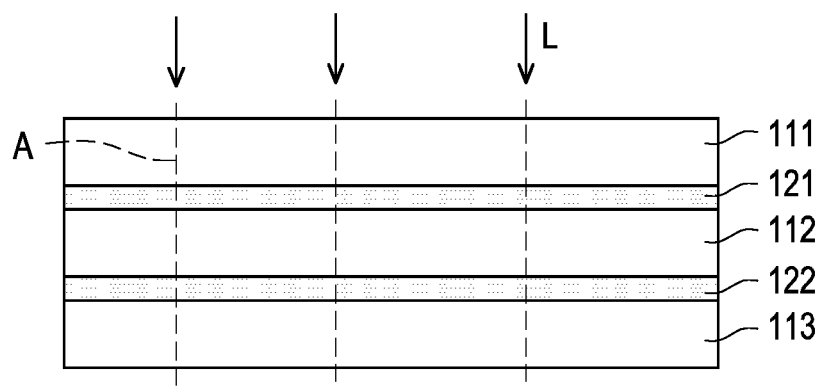
Figure 1E:
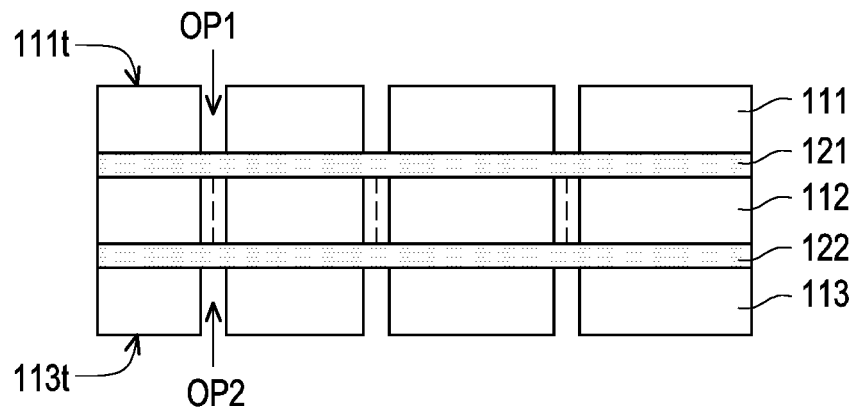
Figure 1F:
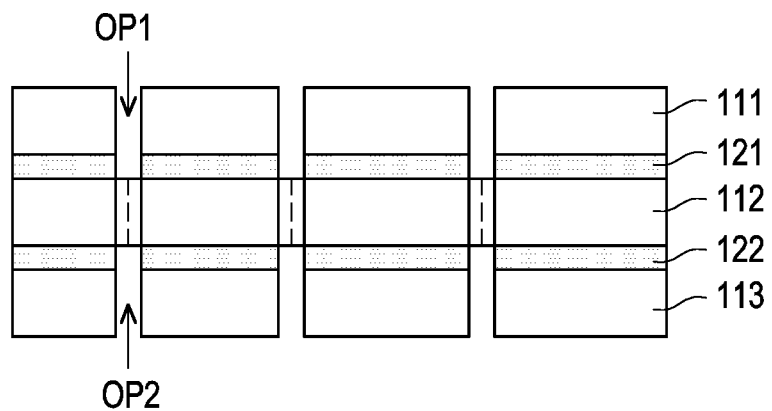
Figure 1G:
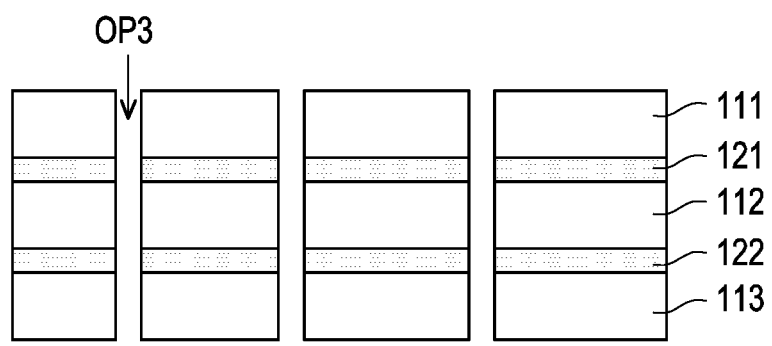
Figure 1H:
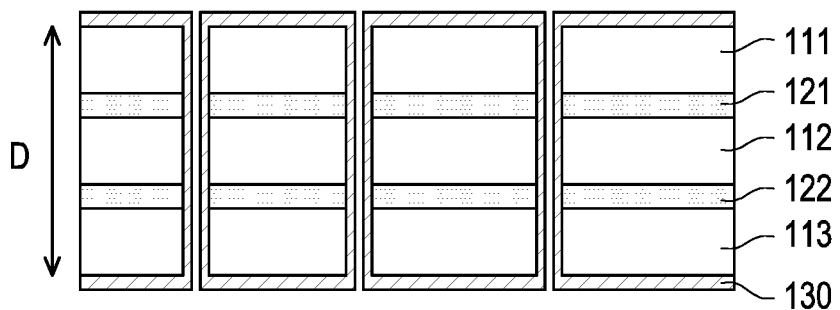

The following describes the steps of forming a conductive connector 130 (shown in FIG. 1H). First, please refer to FIG. 1D. A laser modification process is optionally executed on the glass layer 111, the bonding layer 121, the glass layer 112, the bonding layer 122, and the glass layer 113. For example, a laser beam L is applied to each of the layers to improve the etching ability of a laser passing region A (a dashed line region), thereby reducing the time and difficulty of the subsequent etching process. Here, the laser beam L may be a short-wavelength picosecond laser or the like, and after executing the laser modification process, no holes that actually penetrate each of the layers are generated.

In this embodiment, materials of the bonding layer 121 and the bonding layer 122 include polyimide (PI), benzocyclobutene (BCB), or a combination thereof, but the disclosure is not limited thereto.

Referring to FIG. 1E, after executing the laser modification process, an etching process is executed on the laser passing region A (a modified region) of the glass layer 111 and the glass layer 113 to form multiple openings OP1 and openings OP2, wherein the opening OP1 exposes the bonding layer 121, and the opening OP2 exposes the bonding layer 122. That is to say, an etchant in the etching process starts etching inward from a surface 111t of the glass layer 111 until the etchant stops at the surface of the bonding layer 121, and the etchant on the other side starts etching inward from a surface 113t of the glass layer 113 until the etchant stops at the surface of the bonding layer 122. In other words, in this step, the glass layer 112, the bonding layer 121, and the bonding layer 122 are not substantially etched. Here, the etchant may be hydrogen fluoride (HF) or the like.

In an embodiment not shown, when the etching process takes a long time, the opening has a maximum width at the edges of the glass layers on both sides. That is, the size of the opening is tapered toward the bonding layer, but this disclosure is not limited thereto.

Please refer to FIG. 1F. After forming the openings OP1 and the openings OP2, an etching process is executed on parts of the bonding layer 121 and the bonding layer 122 exposed by the opening OP1 and the opening OP2, so that the opening OP1 and the opening OP2 continue to extend inward until the glass layer 112, so that surfaces on the opposite side of the glass layer 112 are exposed. Here, the etching process may be plasma etching or wet etching (the etchant may be of any suitable type).

Referring to FIG. 1G, an etching process is executed on the laser passing region A of the glass layer 112, so that the opening OP1 and the opening OP2 continue to extend inward until the opening OP1 and the opening OP2 are connected to each other to form an opening OP3, wherein the opening OP3 penetrates the glass layer 111 from the glass layer 113, that is, the opening OP3 passes through the glass layer 111, the bonding layer 121, the glass layer 112, the bonding layer 122, and the glass layer 113 in sequence. Here, the etchant may be hydrogen fluoride (HF) or the like.

In an embodiment not shown, when the laser beam L in FIG. 1D does not penetrate the bonding layer 121 and the bonding layer 122, the etching process may also be executed directly in this step.

Figure 1I:
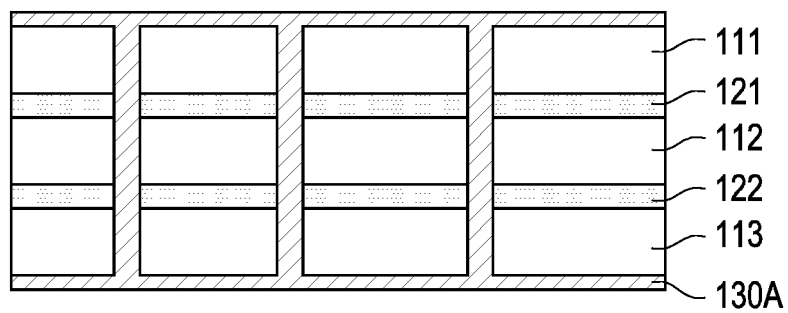
FIG. 1I is a partially schematic cross-sectional view of an alternative embodiment of FIG. 1H.

Referring to FIG. 1H, a conductive material is conformally formed on the surfaces of the glass layer 111 and the glass layer 113 and extends into the opening OP3 to form the conductive connector 130, whereby a glass core part 100 of the glass core substrate is substantially completed, but the disclosure is not limited thereto. In an alternative embodiment, as shown in FIG. 1I, a conductive connector 130A of a glass core part 101 may fill the opening OP3, wherein the conductive connector 130/conductive connector 130A may provide a vertical conductive path D of the glass core part 100/glass core part 101 and may be called a "through glass via" (TGV). According to this, when a subsequent crack exists at the edge of any one of the glass layer 111, the glass layer 112, and the glass layer 113, the crack encounters the obstruction of the bonding layer 121 and the bonding layer 122 during the process of the crack propagating toward the center of the substrate, so the bonding layer 121 and the bonding layer 122 may be regarded as crack-stopping structures.

In some embodiments, the conductive connector 130 may be formed by a copper plating process such as sputtering, atomic layer deposition, or electroless plating, and before the formation of the conductive connector 130, an additional titanium (Ti) seed layer (not shown) may be formed through the process, but the disclosure is not limited thereto.

In this embodiment, forming the conductive connector 130 passing through the glass layer 111, the bonding layer 121, the glass layer 112, the bonding layer 122, and the glass layer 113 is completed in one step, that is, because the conductive material is formed in the opening OP3 penetrating the stacked glass layers (the glass layer 111, the glass layer 112, and the glass layer 113), the conductive connector 130 is not formed by bonding different conductive parts, so that the width of the conductive connector 130 in the bonding layer 121 and the bonding layer 122 is the same as the width in the glass layer 111, the glass layer 112, and the glass layer 113, but the disclosure is not limited thereto.

In some embodiments, the materials of the glass layer 111, the glass layer 112, and the glass layer 113 are different, so the coefficients of thermal expansion (CTE), the Young's modulus of the glass layer 111, the glass layer 112, and the glass layer 113 are different. For example, the glass layer 112 may be glass with a large coefficient of thermal expansion (such as glass with a CTE of 8 ppm at 25° C.), the glass layer 111 and the glass layer 113 may be glass with a coefficient of thermal expansion smaller than that of the glass layer 112 (such as glass with a CTE of smaller than 8 ppm at 25° C.), and the coefficient of thermal expansion of the glass layer 111 is equal to the coefficient of thermal expansion of the glass layer 113. Therefore, after high-temperature condensation, the indentation ability of the glass layer 112 is greater than the indentation abilities of the glass layer 111 and the glass layer 113, thereby pulling the glass layer 111 and the glass layer 113 inward, forming compression stress. In this way, the probability of crack generation and propagation in the glass layer 111 and the glass layer 113 can be more effectively reduced to improve the reliability of the subsequent product. At the same time, this design facilitates the manufacture of a large-sized and highly flat glass core substrate, thereby further improving element integration, but the disclosure is not limited thereto. The materials of the glass layer 111, the glass layer 112, and the glass layer 113 may be the same according to actual design requirements.

Figure 1J:
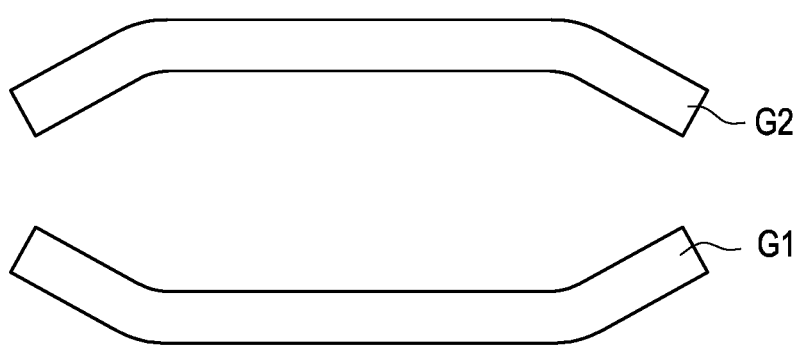
FIG. 1J is a schematic view illustrating a bonding process according to some embodiments of the disclosure.

In FIG. 1J, when the materials of adjacent glass layers G1, G2 are different and designed by aforementioned material rules, adjacent glass layers G1. G2 may have different warpage directions in upper portion and down portion, that is, a warpage direction of the glass layer G1 is opposite to a warpage direction of the glass layer G2, the stress may be effectively offset, thereby the warpage situation is reduced, wherein the glass layers G1, G2 can be two adjacent glass layers in the glass layer 111, the glass layer 112, and the glass layer 113. In this embodiment, only two glass layers are bonded to form the glass core substrate, In some embodiments, the thicknesses of the glass layer 111, the glass layer 112, and the glass layer 113 are the same, but the disclosure is not limited thereto. In other embodiments, the thicknesses of the glass layer 111, the glass layer 112, and the glass layer 113 are different.

In some embodiments, the thickness of any of the glass layer 111, the glass layer 112, and the glass layer 113 is different from that of any of the bonding layer 121 and the bonding layer 122. For example, the thickness of any of the glass layer 111, the glass layer 112, and the glass layer 113 is greater than that of any of the bonding layer 121 and the bonding layer 122, but the disclosure is not limited thereto.

The following embodiments continue to use the reference numerals and some content of the above embodiment, wherein the same or similar numerals are used to represent the same or similar elements and the description of the same technical content is omitted. For the description of the omitted part, reference may be made to the foregoing embodiment and is not repeated in the following embodiments.

Figure 2A:
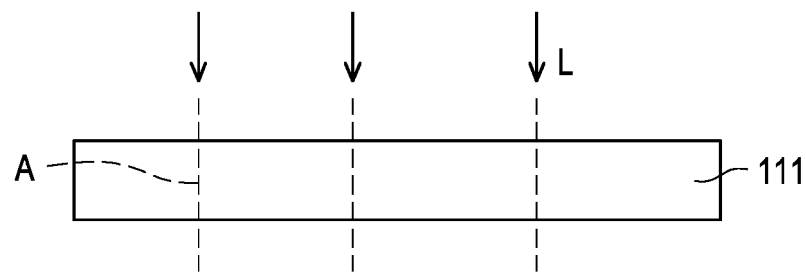
FIG. 2A to FIG. 2F are partially schematic cross-sectional views of a manufacturing method of a glass core substrate according to some embodiments of this disclosure.

Please refer to FIG. 2A. First, the glass layer 111 is provided. Next, a laser modification process is executed on the glass layer 111. For example, the laser beam L may be applied to the glass layer 111 to improve the etching ability through the laser passing region A (the dashed line region). The relevant details are similar to FIG. 1D and are not to be described again here.

Figure 2B:
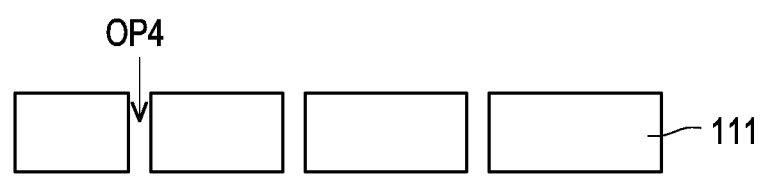

Referring to FIG. 2B, an etching process is executed on the laser-modified region A of the glass layer 111 to form an opening OP4 penetrating the glass layer 111. The etchant may be hydrogen fluoride or the like.

Figure 2C:
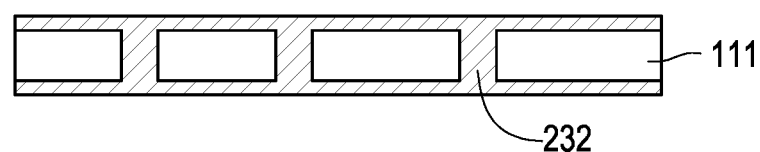
Figure 2D:
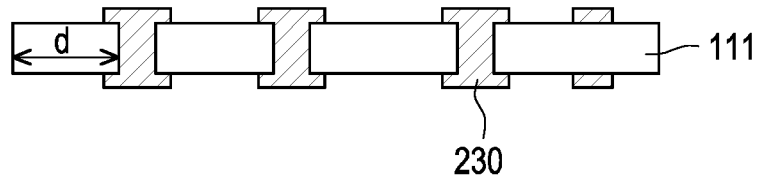

Referring to FIG. 2C and FIG. 2D, a conductive material 232 is formed on the surface of the glass layer 111 and extends into the opening OP4, and the conductive material 232 fills the opening OP4. Then, a patterning process is executed on the conductive material 232 to expose an upper surface and a lower surface of a part of the glass layer 111 to form a conductive connector 230. Here, a distance d between the conductive connector 230 and the edge of the glass layer 111 may not be less than twice the diameter of the conductive connector 230, and this design criterion is also applicable to the design of other glass layers.

Figure 2E:
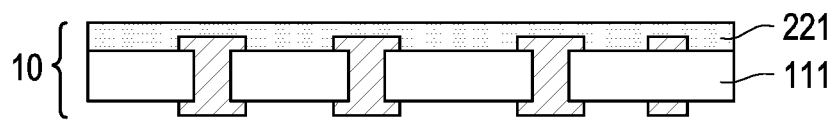
Figure 2F:
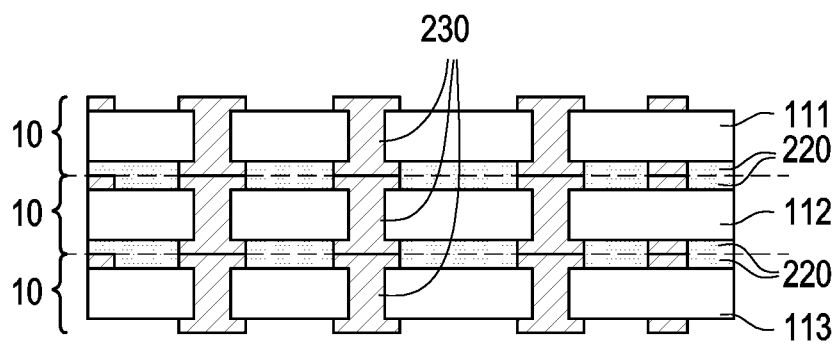

Please refer to FIG. 2E and FIG. 2F. An adhesive material 221 (such as polyimide, benzocyclobutene, and other organic materials or silicon dioxide (SiO2) and other inorganic materials) is formed on the surface of the glass layer 111 to form a bonding component 10. Next, a planarization process, such as a chemical mechanical polishing (CMP) process, is optionally executed on the bonding component 10 to facilitate a subsequent copper-to-copper (Cu to Cu) direct bonding process such as hybrid bonding (as shown as the bonding layer 220 in FIG. 2F). Then, the steps from FIG. 2A to FIG. 2E are repeated to form other bonding components 10, and the bonding components 10 are bonded to each other to form a glass core part 200 of the glass core substrate. For the middle bonding component 10 in the step of FIG. 2E, the adhesive material 221 needs to be further formed on another surface of the glass layer 112 and a planarization process may be optionally executed. Here, the bonding layer 220 between the glass layer 111 and the glass layer 112 is similar to the bonding layer 121, the bonding layer 220 between the glass layer 112 and the glass layer 113 is similar to the bonding layer 122, and the conductive connectors 230 are similar to the conductive connector 130A after being connected in series. Therefore, in this embodiment, the conductive connector passing through the glass layer and the bonding layer is formed by multiple steps. Although three bonding components 10 with the same composition are shown, the materials and circuit designs in the bonding components 10 may be different according to actual design requirements.

In this embodiment, the width of the conductive connector 230 in the bonding layer 220 is larger than the width of the conductive connector 230 in the glass layer 111, the glass layer 112, and the glass layer 113, but the disclosure is not limited thereto.

Figure 2G:
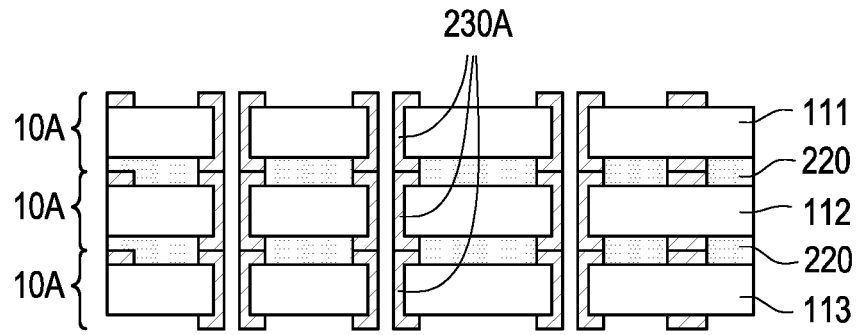
FIG. 2G, FIG. 2H, and FIG. 2I are partially schematic cross-sectional views of some alternative embodiments of FIG. 2F.

Please refer to FIG. 2G. Compared with the glass core part 200 of FIG. 2F, a conductive connector 230A of a glass core part 201 of this embodiment is formed conformally. That is, in the step of FIG. 2C, the conductive material is formed conformally.

Figure 2H:
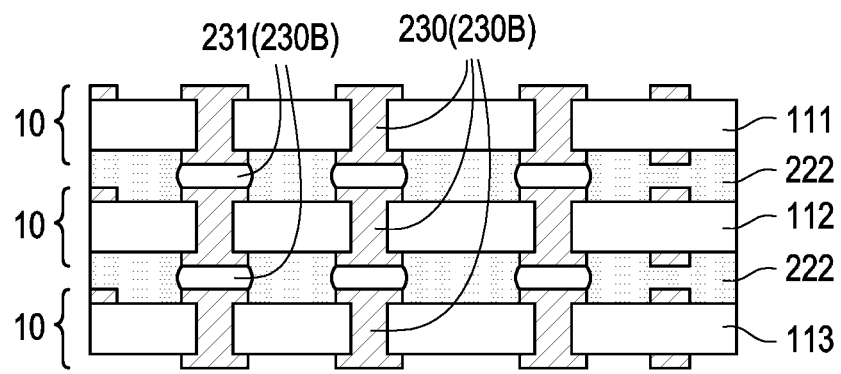

Please refer to FIG. 2H. Compared with the glass core part 200 of FIG. 2F, a conductive connector 230B of a glass core part 202 of this embodiment includes the conductive connector 230 of FIG. 2D and a conductive connector 231 formed by the conductive adhesive material (such as silver glue or copper glue), that is, the bonding components 10 may be bonded and electrically connected through the conductive connector 231, wherein multiple structures shown in FIG. 2D may be subjected to an adhesive bonding process. Next, after the structures are bonded to each other through the conductive connector 231, a filling material 222 (such as a suitable gap-fill polymer) is filled in the gap between the glass layers.

Figure 2I:
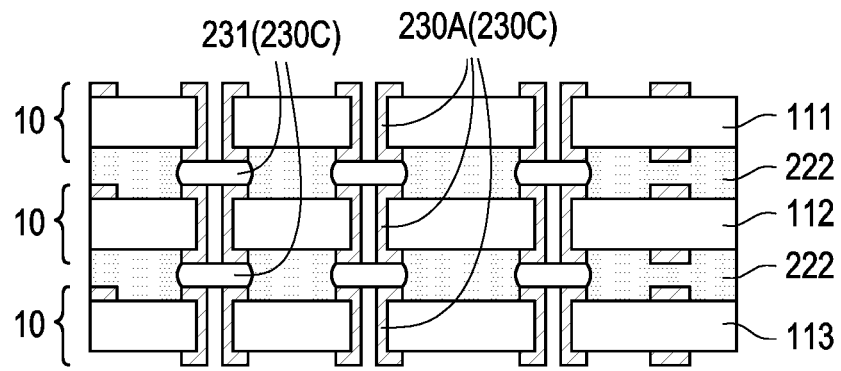

Please refer to FIG. 2I. Compared with the glass core part 202 of FIG. 2H, a conductive connector 230C of a glass core part 203 of this embodiment includes the conductive connector 230A of FIG. 2G and the conductive connector 231 formed by the conductive adhesive material (such as silver glue or copper glue).

Although FIG. 2F to FIG. 2I illustrate that the bonding components are entirely aligned, the disclosure is not limited thereto. In an embodiment not shown, the bonding components may not be entirely aligned. In other words, conductive connectors may be misaligned and partially in contact.

Figure 3A:
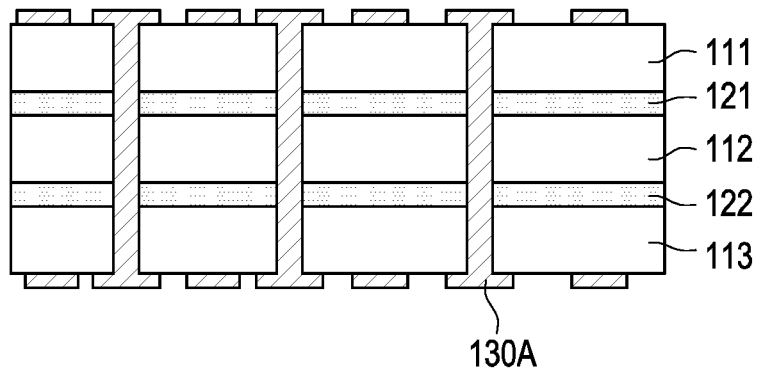
FIG. 3A to FIG. 3B are partially schematic cross-sectional views of a manufacturing method of a glass core substrate according to some embodiments of this disclosure.
Figure 3B:
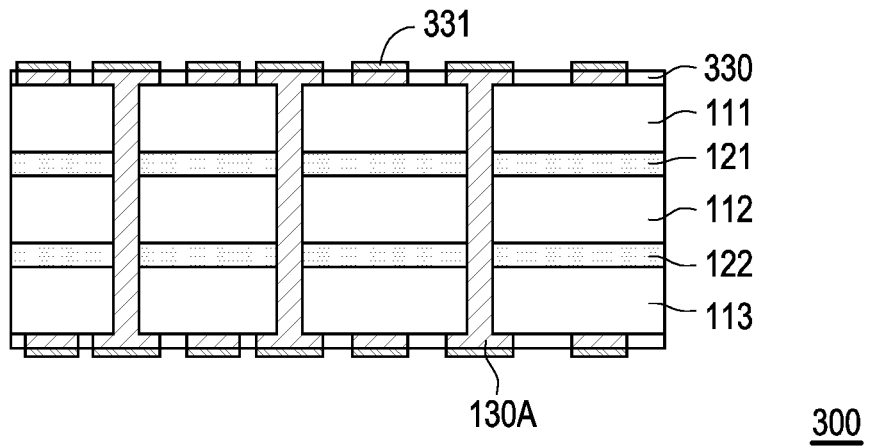

Referring to FIG. 3A and FIG. 3B. The glass core part 101 of FIG. 1I is provided, and a patterning process is executed on the conductive connector 130A to expose parts of the surfaces of the glass layer 111 and the glass layer 113. Next, a solder resist layer 330 is formed on the exposed surfaces of the glass layer 111 and the glass layer 113 to surround the part of the conductive connector 130A located on the surfaces of the glass layer 111 and the glass layer 113. Optionally, a surface treatment may be performed on the part of the conductive connector 130A between the solder resist layer 330 to further form a surface treatment layer 331 disposed on at least one end of the glass core substrate 300, such as a nickel/gold (Ni/Au) layer to improve electrical performance. In this way, the glass core substrate 300 is roughly completed.

Figure 3C:
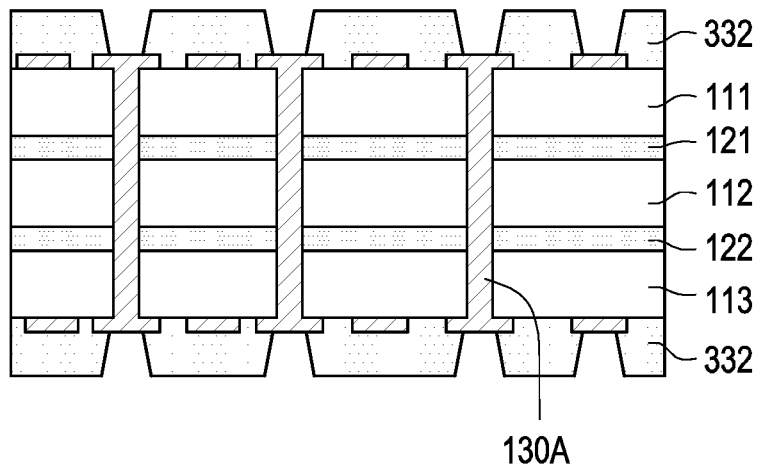
FIG. 3C to FIG. 3E are partially schematic cross-sectional views of a manufacturing method of a glass core substrate according to some embodiments of this disclosure.
Figure 3D:
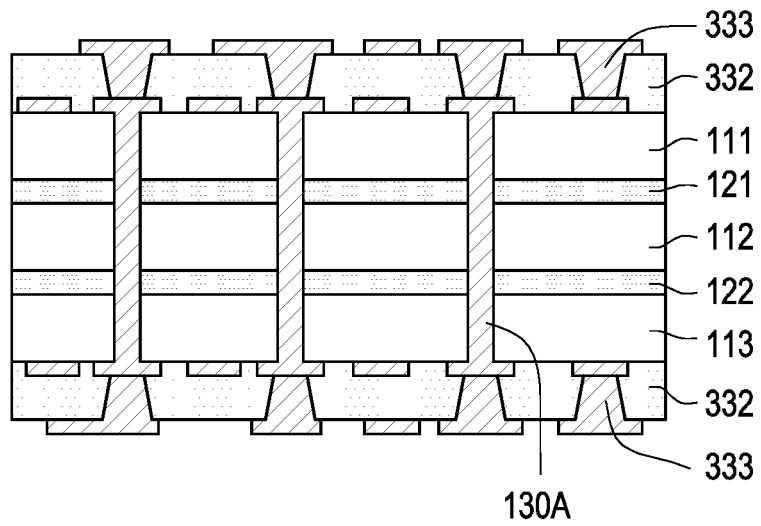
Figure 3E:
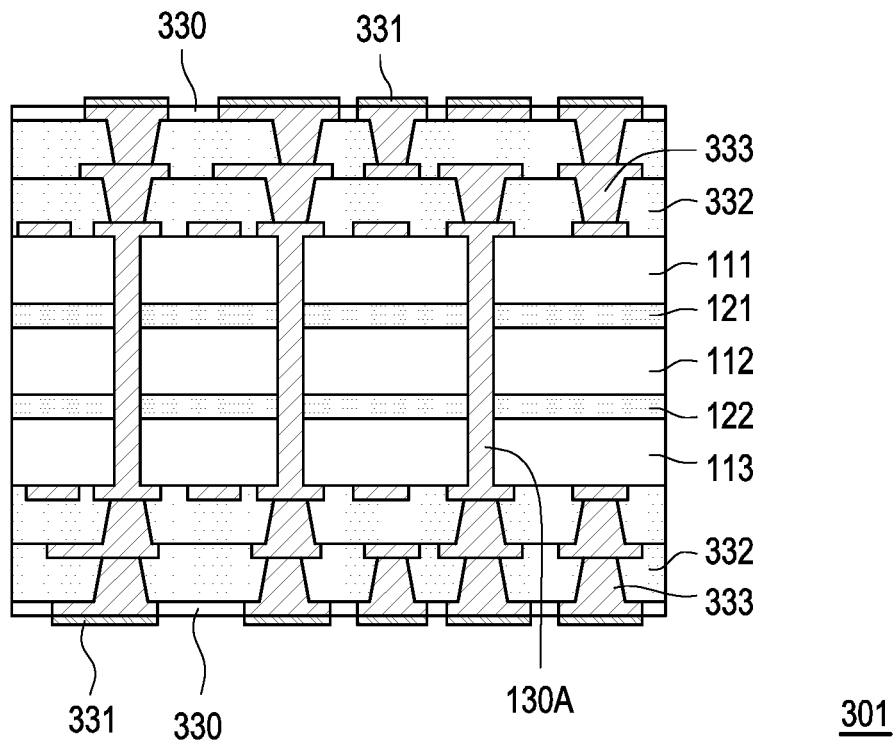

Please refer to FIG. 3C and FIG. 3E. Following the glass core part 101 of FIG. 1I, a patterning process is executed on the conductive connector 130A to expose parts of the surfaces of the glass layer 111 and the glass layer 113. Next, a dielectric layer 332 including multiple openings (the openings are formed in an ABF material through laser drilling or the openings are formed in photo-sensitive polyimide (PSPI) through a photolithography etching process) is formed on the surfaces of the glass layer 111 and the glass layer 113. Also, a conductive layer 333 (with a material such as copper) is formed in the openings to form a circuit layer. Then, the solder resist layer 330 and the surface treatment layer 331 are formed on the outermost conductive layer 333. In this way, a glass core substrate 301 is roughly completed. The steps of FIG. 3C to FIG. 3D may be repeated multiple times according to actual design requirements to form multiple circuit layers.

Figure 4A:
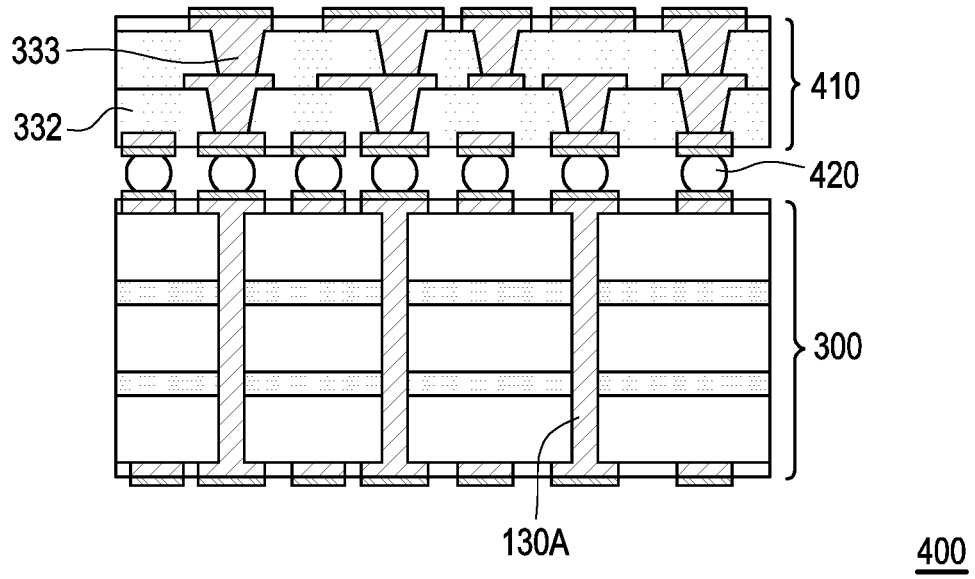
FIG. 4A, FIG. 4B, FIG. 4C, and FIG. 4D are partially schematic cross-sectional views of a glass core substrate according to some embodiments of this disclosure.

Please refer to FIG. 4A. Compared with the glass core substrate 300 of FIG. 3B, a glass core substrate 400 of this embodiment further includes a circuit layer 410 and multiple solder balls 420. The solder balls 420 are located between the circuit layer 410 and the conductive connector 130A, and the circuit layer 410 is composed of a structure similar to the alternating stacking of the dielectric layer 332 and the conductive layer 333, which is not limited by this disclosure.

Figure 4B:
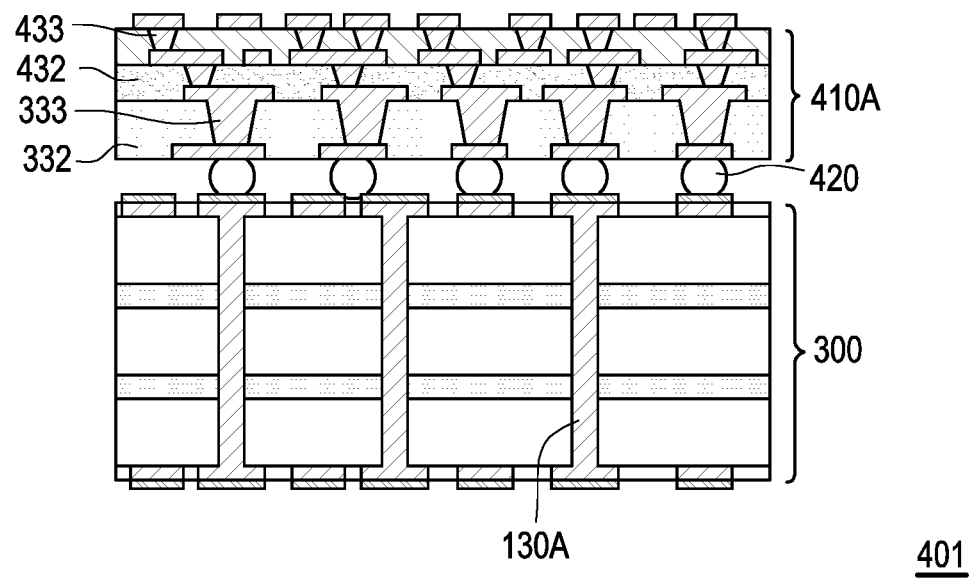

Please refer to FIG. 4B. Compared with the glass core substrate 400 of FIG. 4A, a circuit layer 410A of a glass core substrate 401 of this embodiment has different line spacings. For example, the glass core substrate 401 may have circuit layers similar to a circuit layer with a thick spacing (such as a copper wire with a line width spacing from about 5 microns to about 25 microns) composed of the dielectric layer 332 and the conductive layer 333 and a circuit layer with a thin spacing (such as a copper conductor with a line width spacing from about 1.0 microns to about 10 microns) composed of a dielectric layer 432 (such as benzocyclobutene (BCB) or other suitable organic material such as polyimide) and a conductive layer 433 (with a material such as copper).

Figure 4C:
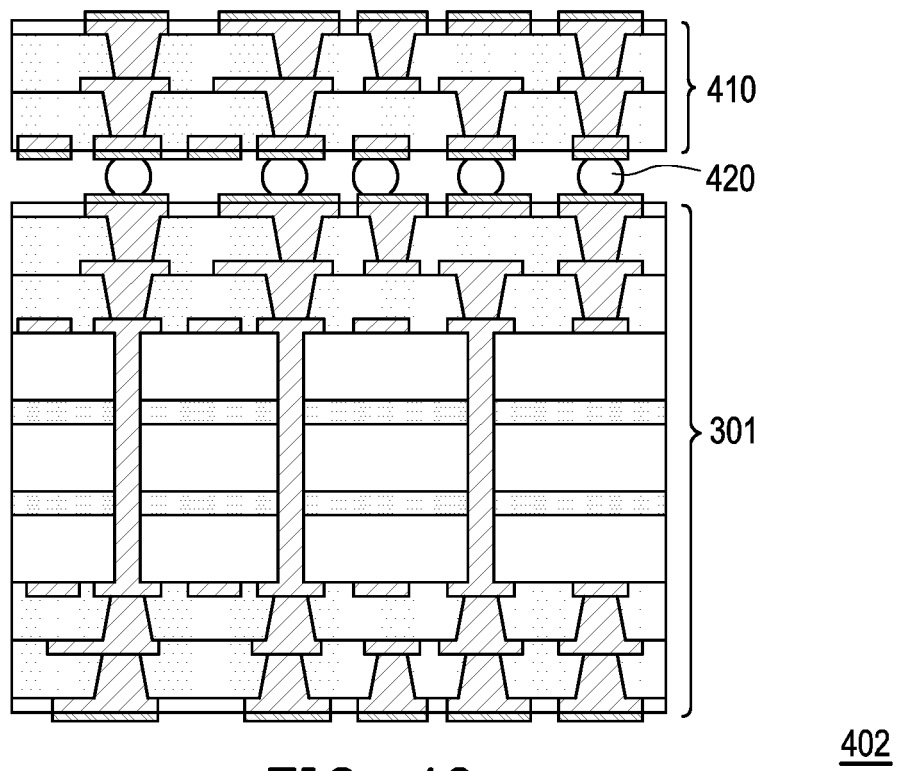

Please refer to FIG. 4C. Compared with the glass core substrate 400 of FIG. 4A, a glass core substrate 402 of this embodiment uses the glass core substrate 301 of FIG. 3E.

Figure 4D:
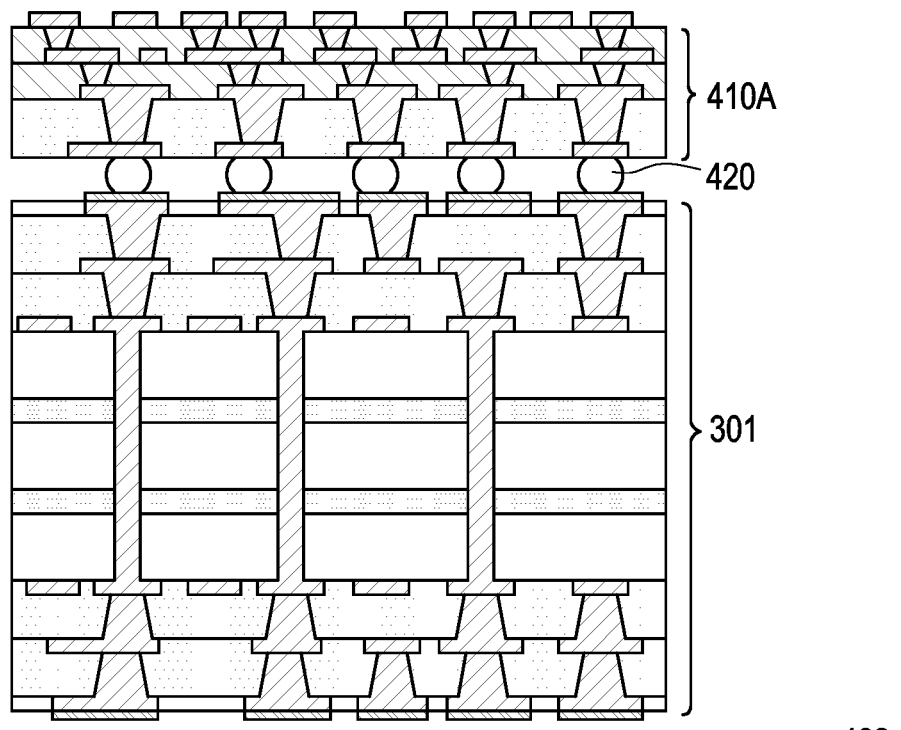

Please refer to FIG. 4D. Compared with the glass core substrate 401 of FIG. 4B, a glass core substrate 403 of this embodiment uses the glass core substrate 301 of FIG. 3E.

The circuit layer mentioned above is an exemplary description, and any appropriate circuit may be used according to actual design requirements. For example, a structure of alternately stacking the dielectric layer 332 and the conductive layer 333 may be a redistribution circuit layer (RDL).

Figure 5A:
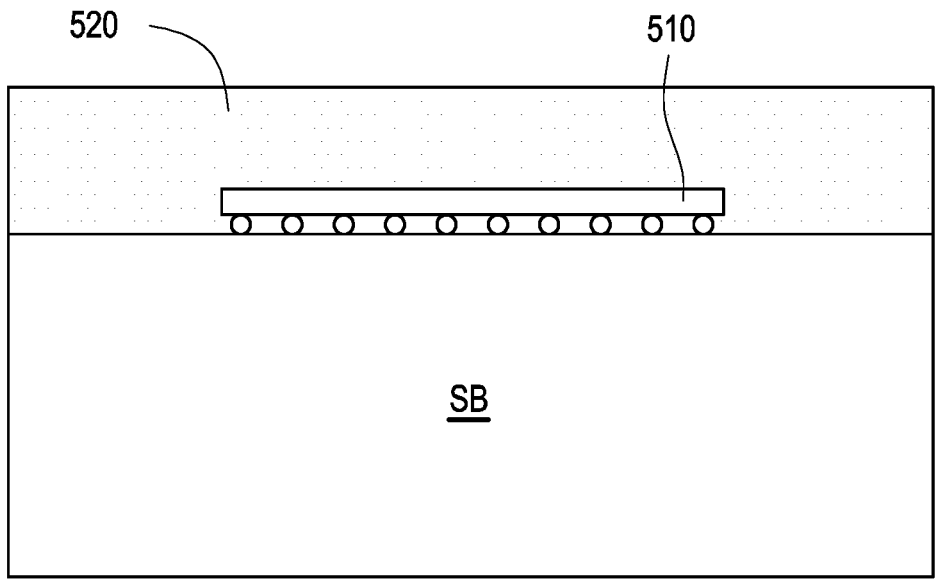
FIG. 5A and FIG. 5B are partially schematic cross-sectional views of an application of a glass core substrate according to some embodiments of this disclosure.

Please refer to FIG. 5A. In an electronic assembly of this embodiment, a chip 510 is disposed on a glass core substrate SB, and the chip 510 is optionally encapsulated by an encapsulation body 520. The glass core substrate SB may be a specific implementation of the various glass core substrates above, such as the glass core substrates 300, 301, 400, 401, 402, 403, or the like.

In some embodiments, the chip 510 is connected to the surface of the glass core substrate SB using, for example, flip-chip bonding. For example, a conductive bump of the chip 510 may be in direct contact with a surface circuit of the glass core substrate SB to form an electrical connection, but the disclosure is not limited thereto. The chip 510 may also be bonded to the surface of the glass core substrate SB using other suitable methods. The chip 510 here is, for example, a logic chip, a memory chip, a three-dimensional integrated circuit (3DIC) chip (such as a high bandwidth memory chip), XPU, I/O, CPO, and/or the like. The 3DIC chip includes multiple layers stacked on each other and is formed with through-silicon vias (TSVs) to provide vertical electrical connections between the layers, but the disclosure is not limited thereto.

Although only one chip 510 is shown in the current drawing, this disclosure does not limit the number of the chip 510. The number of the chip 510 may be determined according to actual design requirements, such as two or more chips with the same or different functions.

In some embodiments, the encapsulation body 520 may be a molding compound formed by a molding process, such as being formed by an insulating material such as epoxy resin or other suitable resins, but the disclosure is not limited thereto.

Figure 5B:
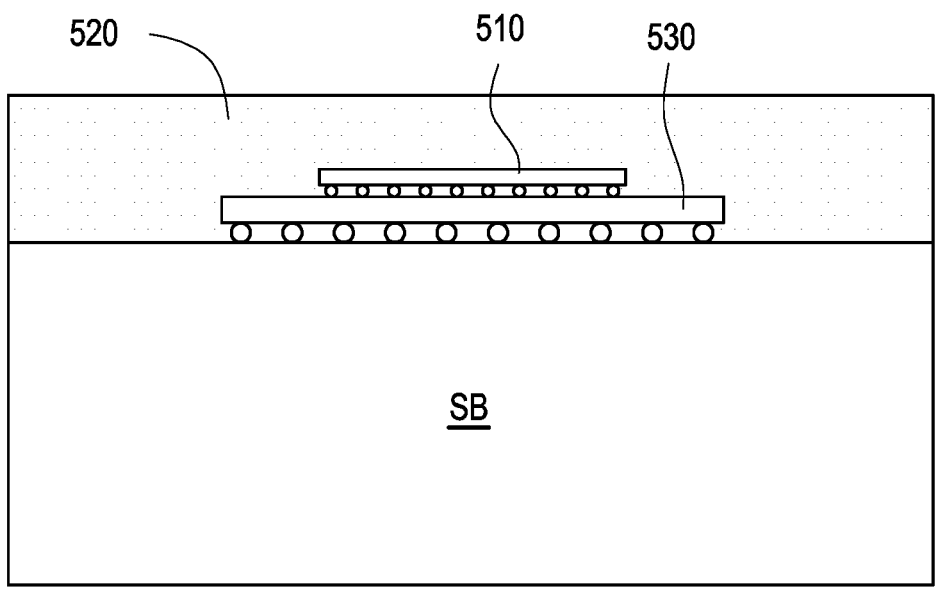

Please refer to FIG. 5B. Compared with the embodiment of FIG. 5A, the electronic assembly of this embodiment further includes an interposer layer 530 disposed between the chip 510 and the glass core substrate SB, wherein the interposer layer 530 may be any suitable type, which is not limited by this disclosure.

To sum up, in this disclosure, the bonding layer is used as the crack-stopping structure through the design of the stacked glass layers. In this way, the phenomenon of rapid propagation of brittle cracks in glass from the edge to the center of the substrate can be reduced, effectively inhibiting the propagation of cracks, thereby improving the reliability of the subsequent product.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A glass core substrate, comprising:
   a first glass layer;
   a second glass layer, disposed on the first glass layer;
   a first bonding layer, bonded to the first glass layer and the second glass layer;
   a conductive connector, passing through the first glass layer, the first bonding layer, and the second glass layer, wherein the conductive connector is configured to provide a vertical conductive path to the glass core substrate, wherein a width of the conductive connector in a second bonding layer is greater than a width of the conductive connector in the first glass layer and is greater than a width of the conductive connector in the second glass layer, wherein the conductive connector comprises a conductive adhesive material in the second bonding layer; and
   a surface treatment layer, disposed on at least one end of the glass core substrate.

2. The glass core substrate according to claim 1, wherein a material of the first bonding layer comprises polyimide, benzocyclobutene, or a combination thereof.

3. The glass core substrate according to claim 1, wherein a coefficient of thermal expansion of the first glass layer is different from a coefficient of thermal expansion of the second glass layer, a Young's modulus of the first glass layer is different from a Young's modulus of the second glass layer and/or a thickness of the first glass layer is different from a thickness of the second glass layer.

4. The glass core substrate according to claim 1, wherein a coefficient of thermal expansion of the first glass layer is different from a coefficient of thermal expansion of the second glass layer.

5. The glass core substrate according to claim 1, wherein a distance between the conductive connector and an edge of the first glass layer and/or the second glass layer is not less than twice a diameter of the conductive connector.

6. The glass core substrate according to claim 1, further comprising at least two solder resist layers surrounding parts of the conductive connector located on surfaces of the first glass layer and the second glass layer.

7. The glass core substrate according to claim 1, further comprising at least two circuit layers disposed on surfaces of the first glass layer and the second glass layer respectively.

8. The glass core substrate according to claim 1, further comprising a circuit layer and a plurality of solder balls, wherein the solder balls are located between the circuit layer and the conductive connector.

9. The glass core substrate according to claim 8, wherein the circuit layer has different spacings.

10. The glass core substrate according to claim 1, further comprising:
    a third glass layer, disposed on the second glass layer; and
    a second bonding layer, disposed between the second glass layer and the third glass layer, wherein the conductive connector further passes through the second bonding layer and the third glass layer.

11. The glass core substrate according to claim 10, wherein a coefficient of thermal expansion of the second glass layer is greater than a coefficient of thermal expansion of the first glass layer, the coefficient of thermal expansion of the second glass layer is greater than a coefficient of thermal expansion of the third glass layer, and the coefficient of thermal expansion of the first glass layer is equal to the coefficient of thermal expansion of the third glass layer.

12. A manufacturing method of a glass core substrate, comprising:
    providing a first glass layer and a second glass layer;
    bonding the first glass layer and the second glass layer through a first bonding layer;
    forming a conductive connector passing through the first glass layer, the first bonding layer, and the second glass layer, wherein the conductive connector is configured to provide a vertical conductive path to the glass core substrate, wherein a width of the conductive connector in a second bonding layer is greater than a width of the conductive connector in the first glass layer and is greater than a width of the conductive connector in the second glass layer, wherein the conductive connector comprises a conductive adhesive material in the second bonding layer; and
    forming a surface treatment layer on at least one end of the glass core substrate.

13. The manufacturing method of the glass core substrate according to claim 12, wherein the step of forming the conductive connector comprises executing a laser modification process, executing an etching process, or a combination thereof.

14. The manufacturing method of the glass core substrate according to claim 12, further comprising:
    providing a third glass layer;
    bonding the second glass layer and the third glass layer through the second bonding layer; and
    further passing the conductive connector through the second bonding layer and the third glass layer.

15. The manufacturing method of the glass core substrate according to claim 12, wherein the conductive connector is formed in one step.

16. The manufacturing method of the glass core substrate according to claim 12, wherein the conductive connector is formed in a plurality of steps, and the step of forming the conductive connector comprises executing a direct bonding process.

17. The manufacturing method of the glass core substrate according to claim 12, wherein the step of forming the conductive connector comprises executing an adhesive bonding process through a conductive adhesive material.

* * * * *